US008058701B2

United States Patent
Kim et al.

(10) Patent No.: US 8,058,701 B2
(45) Date of Patent: Nov. 15, 2011

(54) ANTIFUSE STRUCTURES, ANTIFUSE ARRAY STRUCTURES, METHODS OF MANUFACTURING THE SAME

(75) Inventors: Deok-kee Kim, Seoul (KR); Yoon-dong Park, Yongin-si (KR); Seung-hoon Lee, Seoul (KR); I-hun Song, Seongnam-si (KR); Won-joo Kim, Hwaseong-si (KR); Young-gu Jin, Hwaseong-si (KR); Hyuk-soon Choi, Seongnam-si (KR); Suk-pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 441 days.

(21) Appl. No.: 12/216,094

(22) Filed: Jun. 30, 2008

(65) Prior Publication Data
US 2009/0096060 A1    Apr. 16, 2009

(30) Foreign Application Priority Data

Oct. 16, 2007   (KR) .................. 10-2007-0104060

(51) Int. Cl.
*H01L 23/52*       (2006.01)

(52) U.S. Cl. ................. 257/530; 257/E23.147; 438/131

(58) Field of Classification Search .................. 257/530, 257/E23.147, 50, 209; 438/131
See application file for complete search history.

(56) References Cited

U.S. PATENT DOCUMENTS

| 7,564,707 B2 * | 7/2009 | Kleveland ........................ 365/96 |
| 7,638,855 B2 * | 12/2009 | Lung ............................. 257/530 |
| 2007/0042553 A1 * | 2/2007 | Kuesters et al. .............. 438/278 |
| 2008/0246098 A1 * | 10/2008 | Kurjanowicz ................. 257/408 |

FOREIGN PATENT DOCUMENTS

| EP | 000509631 A1 * | 10/1992 |
| JP | 2003086768 | * 3/2003 |

OTHER PUBLICATIONS

Quirk et al., Semiconductor Manufacturing Technology, Prentice Hall, Upper Saddle NJ, © 2001, pp. 286-287,506.*

* cited by examiner

*Primary Examiner* — Matthew Landau
*Assistant Examiner* — Sun M Kim
(74) *Attorney, Agent, or Firm* — Harness, Dickey & Pierce, P.L.C.

(57) ABSTRACT

Antifuse structures, antifuse arrays, methods of manufacturing, and methods of operating the same are provided. An antifuse structure includes bitlines formed as first diffusing regions within a semiconductor substrate, an insulation layer formed on the bitlines, and wordlines formed on the insulation layer. An antifuse array includes a plurality of antifuse structures arranged in an array.

55 Claims, 10 Drawing Sheets

ANTIFUSE STRUCTURES, ANTIFUSE ARRAY STRUCTURES, METHODS OF MANUFACTURING THE SAME

PRIORITY STATEMENT

This non-provisional patent application claims priority under 35 U.S.C. §119 to Korean Patent Application No. 10-2007-0104060, filed on Oct. 16, 2007, in the Korean Intellectual Property Office, the entire contents of which is incorporated herein by reference.

BACKGROUND

Description of the Related Art

Conventional semiconductor devices, for example, a conventional semiconductor memory device, may include a relatively large number of cells. If even one of the cells is defective, the semiconductor memory device may not function properly. If the semiconductor memory device does not function properly, it may need to be discarded. This may reduce (e.g., severely reduce) product yield.

To assist in improving product yield, conventional semiconductor memory devices may include a plurality of redundancy cells (e.g., pre-formed redundancy cells) for replacing defective cells. The plurality of redundancy cells may comprise a plurality of spare rows and a plurality of spare columns, each of which may be formed at an interval of a few (e.g., 1, 2, 3, . . . ) cell arrays apart. A repairing operation using the redundancy cells may be performed by replacing a defective row and/or column with a spare row and/or column of the redundancy memory cells.

Figure 1:
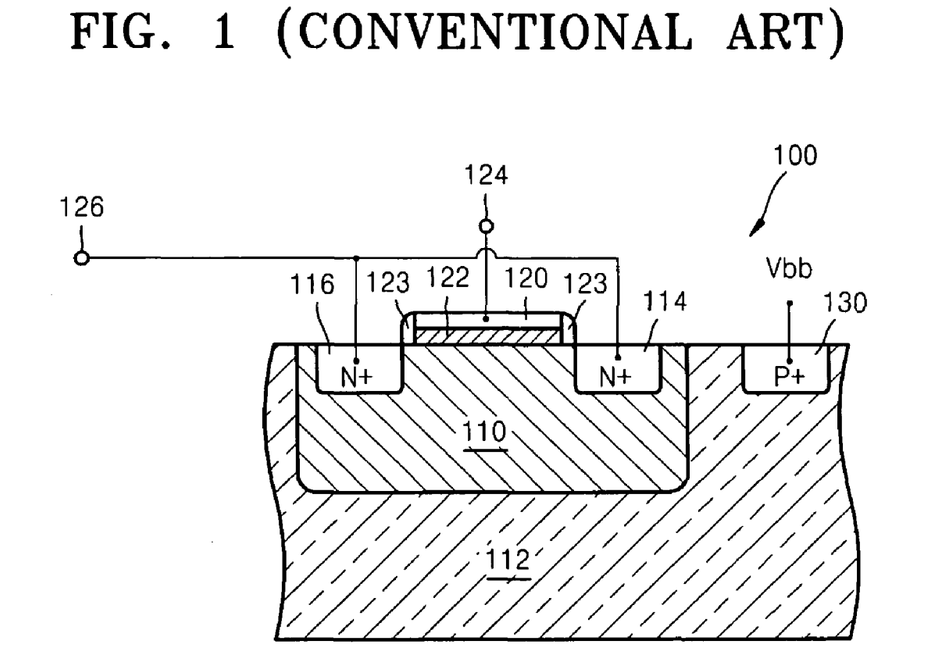
FIG. 1 is a diagram of a conventional antifuse.

FIG. 1 is a diagram of a conventional antifuse. Referring to FIG. 1, a conventional antifuse may include an n-type well region 110 formed on or within a p-type semiconductor substrate 112. An n-type source diffusing region 114 and a n-type drain diffusing region 116 may be formed within the n-type well region 110. The n-type source diffusing region 114 and the n-type drain diffusing region 116 may form ohmic contacts with the n-type well region 110.

A gate dielectric layer 122 and a gate electrode 120 may be formed sequentially on the n-type well region 110. A spacer 123 may be formed at each end of the gate dielectric layer 122 and the gate electrode 120. The gate electrode 120 may be connected to a first terminal 124 of the antifuse 100. The source diffusing region 114 and the drain diffusing region 116 may be connected to a second terminal 126 of the antifuse 100. A p-type diffusing region 130 may also be formed within the semiconductor substrate 112. The p-type diffusing region 130 may provide ohmic contact coupling between the semiconductor substrate 112 and a voltage Vbb.

In FIG. 1, the conventional antifuse 100 may have a common transistor structure, in which a source and a drain may be connected to each other using an n-type well structure. However, if the structure shown in FIG. 1 is arranged in an array, the array structure may require a relatively large area or region and/or require a relatively high driving voltage. Accordingly, increasing integration of a semiconductor device may be relatively difficult.

SUMMARY

Example embodiments relate to antifuse structures and antifuse arrays, for example, antifuses in which all or substantially all antifuse cells connected to a bitline via a single contact may be connected to each other so that all or substantially all antifuse cells connected to the bitline may be selected via a wordline perpendicular to the bitline. Example embodiments also relate to methods of fabricating and operating antifuses and antifuse arrays.

At least one example embodiment provides a simpler antifuse structure in which all or substantially all antifuse cells may be connected by a bitline and a wordline such that all or substantially all cells may be selected for writing/reading data simultaneously or concurrently.

According to at least one example embodiment, an antifuse structure may include a bitline formed as a first diffusing region within a semiconductor substrate, an insulation layer formed on the bitline, and a wordline formed on the insulation layer.

According to at least some example embodiments, the antifuse structure may further include a second diffusing region formed in a region surrounding the bitline. The bitline may be a region doped with a first dopant, and the second diffusing region may be a region doped with a second dopant. The antifuse structure may further include shallow trench isolations formed at both ends of the bitline. The bitline may be a region doped with a first dopant, and the second diffusing region may be a region doped with a second dopant.

At least one other example embodiment provides an antifuse array. According to at least this example embodiment, the antifuse array may include a plurality of bitlines formed as a first diffusing region in a first direction within a semiconductor substrate, an insulation layer formed on the bitlines, and wordlines formed on the insulation layer in a direction crossing the bitlines.

At least one other example embodiment provides a method of manufacturing an antifuse structure. According to at least this example embodiment, a diffusing region may be formed within a semiconductor substrate. The diffusing region may include a bitline. An insulation layer may be formed on the bitline, and a wordline may be formed on the insulation layer.

At least one other example embodiment provides a method of manufacturing an antifuse array structure. According to at least this example embodiment, a plurality of antifuse structures may be formed in an array structure. For example, a plurality of diffusing regions may be formed within a semiconductor substrate. Each of the plurality of diffusing regions may include a bitline. A plurality of insulation layers may be formed on the bitlines, and a plurality of wordlines may be formed on the insulation layers.

At least one other example embodiment provides an antifuse structure. The antifuse structure may include at least one bitline formed within a semiconductor substrate. The bitline may be a portion of the semiconductor substrate doped with a first dopant. At least one insulation layer may be formed on the bitline, and at least one wordline may be formed on the at least one insulation layer. The at least one wordline may be doped with a second dopant. The second dopant may be different from the first dopant.

At least one other example embodiment provides an antifuse array structure. The antifuse array structure may include a plurality of bitlines formed within a semiconductor substrate. The plurality of bitlines may be formed in separate portions of the semiconductor substrate by doping each region with a first dopant. A plurality of insulation layers may be formed on the bitlines, and a plurality of wordlines may be formed on the insulation layers. The wordlines may be doped with a second dopant. The second dopant may be different from the first dopant.

According to at least some example embodiments, an upper surface of at least one bitline may be planar with an upper surface of the semiconductor substrate. At least one bitline may have a semi-circular shape.

According to at least some example embodiments, at least one of the plurality of second diffusing regions and the plurality of bitlines may have has a semi-circular shape. An upper surface of each of the plurality of bitlines may be planar with an upper surface of the semiconductor substrate. Each of the bitlines may have a first length and a first width, wherein the first length is greater than the first width. The plurality of bitlines may be spaced apart from one another by a first distance in the first direction. The first distance may be greater than a width of each of the plurality of bitlines.

According to at least some example embodiments, the diffusing region may be formed by doping a portion of the semiconductor substrate with a first dopant to form the diffusing region, and doping a portion of the diffusing region with a second dopant to form the bitline. The second dopant may be different from the first dopant. The insulation layer may include at least a first portion and a second portion. The first portion may be thicker than the second portion. The forming of the insulation layer may include forming the first portion of the insulation layer on an upper surface the second diffusing region, and forming the second portion of the insulation layer on an upper surface of the bitline.

According to at least some example embodiments, the bitline may compose the entire diffusing region. In at least this example embodiment, forming of the bitline may include doping a portion of the semiconductor substrate with a first dopant to form the bitline.

BRIEF DESCRIPTION OF THE DRAWINGS

Example embodiments will become more apparent by describing in detail the attached drawings in which.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 2A:
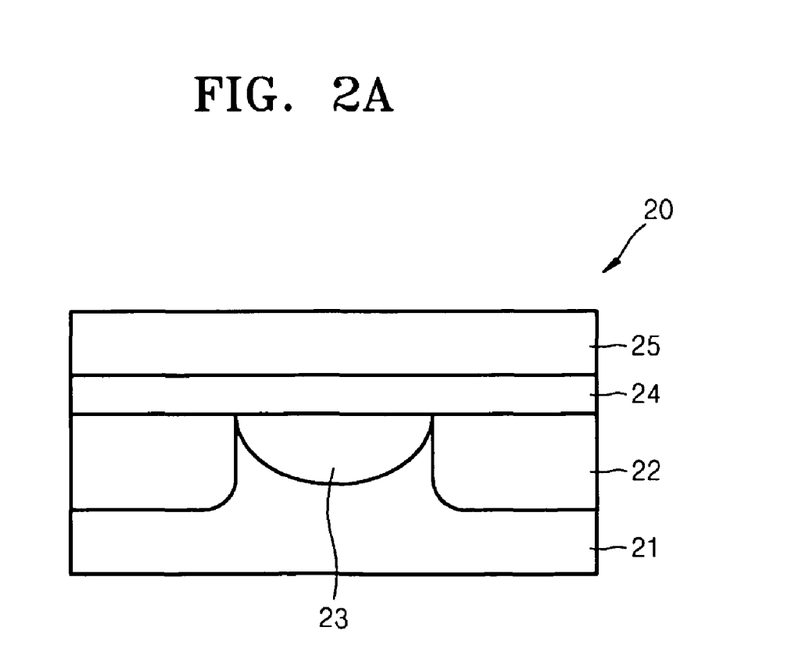
FIG. 2A is a diagram of an antifuse structure according to an example embodiment.

FIG. 2A is a diagram of an antifuse structure according to an example embodiment. Referring to FIG. 2A, an antifuse structure 20 may include a semiconductor substrate 21 having a bitline 23 formed at least partially within the substrate 21. The bitline 23 may be formed as a first diffusing region. The bitline 23 may be formed within (e.g., entirely within) the substrate 21, such that an upper surface of the bitline 23 is planar or substantially planar with the upper surface of the substrate 21. The antifuse structure 20 may further include an insulation layer 24 and a wordline 25 formed (e.g., sequentially formed) on the semiconductor substrate 21. If the bitline 23 is a region formed of a first type of dopant, the wordline 25 may be a region formed of a second type of dopant. The first and second types of dopant may be different.

For example, if the bitline 23 is formed of an n-type dopant, the wordline 25 may be formed of a poly-silicon doped with a p-type dopant. In this example, the semiconductor substrate 21 may be a p-type semiconductor substrate. The antifuse structure 20 may further include a shallow trench isolation region 22 formed at each end of the bitline 23. The shallow trench isolation regions 22 may be formed to a depth greater than the depth at which the bitline 23 is formed in the substrate 21. As shown in FIG. 2A, the bitline 23 may be formed to have a semi-circular or substantially semi-circular shape. However, the bitline 23 may have any suitable shape.

Still referring to FIG. 2A, the bitline 23 may be formed in a first portion of the semiconductor substrate 21, and the shallow trench isolation regions 22 may be formed in second and third portions of the substrate 21. Each of the shallow trench isolation regions 22 may border the bitline 23. Upper surfaces of the bitline 23 and the shallow trench isolation regions 22 may comprise the upper surface (e.g., entire upper surface) of the substrate 21.

Figure 2B:
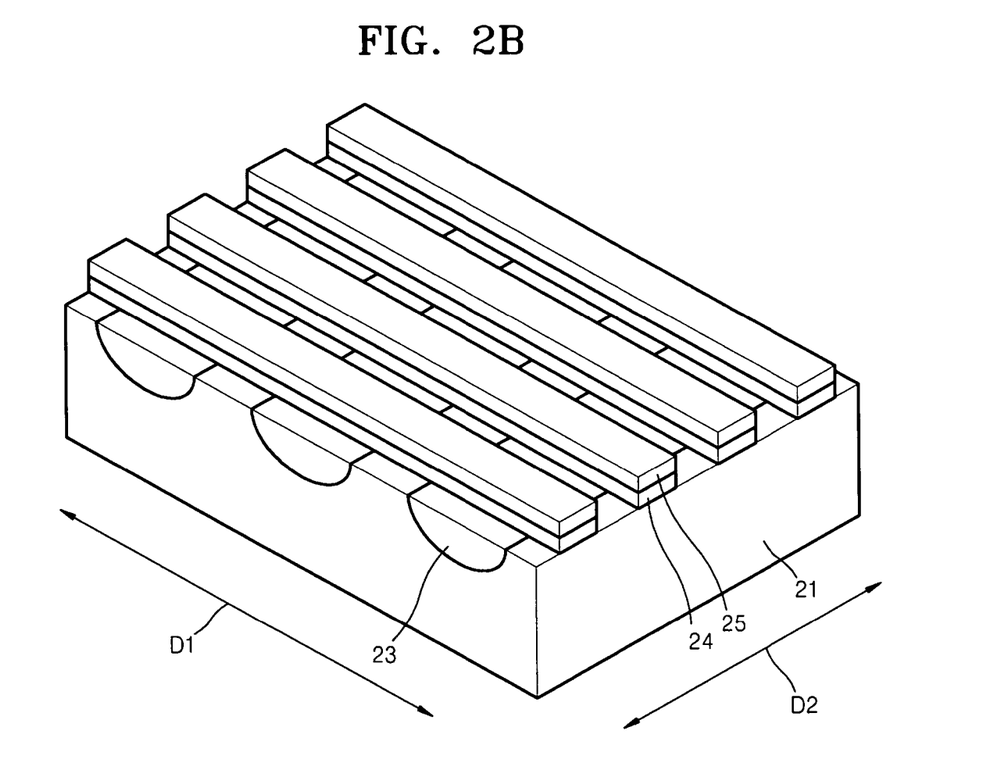
FIG. 2B is a perspective view of an antifuse array structure according to an example embodiment.

FIG. 2B is a perspective view of an antifuse array structure according to an example embodiment. The antifuse array structure of FIG. 2B may include a plurality of antifuse structures in accordance with the example embodiment shown in FIG. 2A.

As shown in FIG. 2B, the antifuse array structure may include a plurality of bitlines 23 and a plurality of wordlines 25 formed perpendicular or substantially perpendicular to the plurality of bitlines 23. For example, the plurality of bitlines 23 and the plurality of wordlines 25 may be formed to cross one another. An insulation layer 24 may be formed between each wordline 25 and the plurality of bitlines 23. According to at least one example embodiment, each insulation layer 24 may be formed to have the same or substantially the same shape as a corresponding wordline 25.

Still referring to FIG. 2B, each bitline 23 may have a first length and a first width, wherein the first length may be greater than the first width. The first width may extend in a first direction D1, and the first length may extend in a second direction D2. The plurality of bitlines 23 may be spaced apart from one another in the first direction D1. The bitlines 23 may be spaced apart from one another by a first distance. The first distance may be greater than the width of a bitline 23.

Each wordline 25 may have a first length and a first width, wherein the first length may be greater than the first width. The first length may extend in the first direction D1, and the first width may extend in the second direction D2. The plurality of wordlines 25 may be spaced apart from one another in the second direction D2.

Figure 3A:
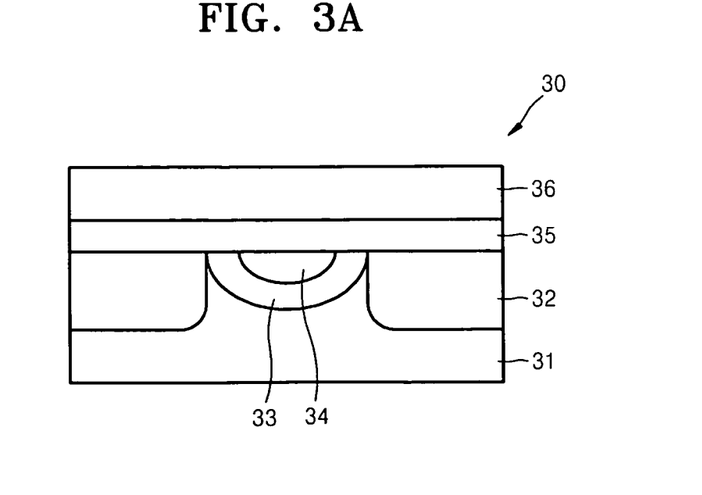
FIG. 3A is a diagram of an antifuse structure according to another example embodiment.

FIG. 3A is a diagram of an antifuse structure according to another example embodiment. Referring to FIG. 3A, an antifuse structure 30 may include a bitline 34 formed as a first diffusing region within a semiconductor substrate 31, and a second diffusing region 33 also formed within the semiconductor substrate 31. The second diffusing region 33 may surround the bitline 34 within the semiconductor substrate 31. The bitline 34 and the second diffusing region 33 may be formed within (e.g., entirely within) the substrate 31, such that an upper surface of the bitline 34 is planar or substantially planar with the upper surface of the substrate 31. Upper surfaces of the second diffusing region 33 may also be planar or substantially planar with the upper surface of the substrate 31.

The bitline 34 may be doped with a first type of dopant and the second diffusing region 33 may be doped with a second type of dopant. The first type of dopant and the second type of dopant may be different. For example, if the bitline 34 is a region doped with a p-type dopant, the second diffusing region 33 may be doped with an n-type dopant. In this example, the second diffusing region 33 and the bitline 34 may form a p-n diode structure. The antifuse structure 30 may further include an insulation layer 35 and a wordline 36 formed (e.g., sequentially formed) on the semiconductor substrate 31. A shallow trench isolation 32 may be formed at each end of the second diffusing region 33.

Still referring to FIG. 3A, the bitline 34 may be formed in a first portion of the semiconductor substrate 31, the second diffusing region 33 may be formed in a second portion of the substrate 31, and the shallow trench isolation regions 32 may be formed in third and fourth portions of the substrate 31. Each of the shallow trench isolation regions 32 may border the second diffusing region 33, which may surround the bitline 34 within the semiconductor substrate 31. Upper surfaces of the bitline 34, the second diffusing region 33, and the shallow trench isolation regions 22 may comprise the upper surface (e.g., entire upper surface) of the substrate 31.

Figure 3B:
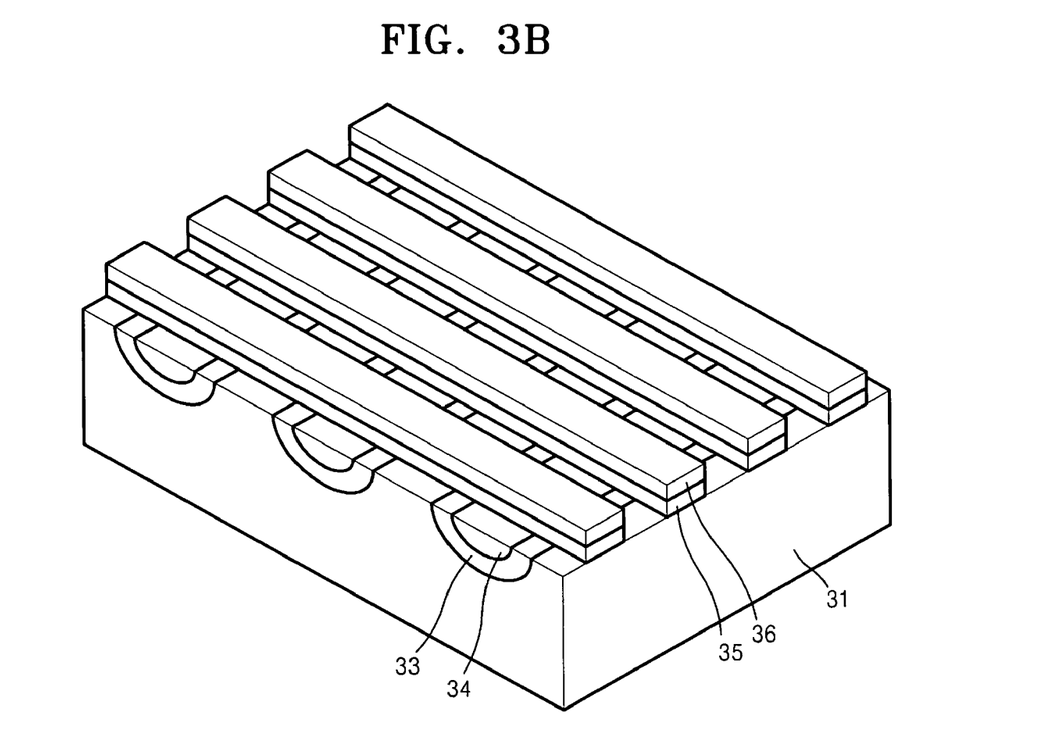
FIG. 3B is a perspective view of an antifuse array structure according to another example embodiment.

FIG. 3B is a perspective view of an antifuse array structure according to another example embodiment. The antifuse array structure of FIG. 3B may include a plurality of antifuses 30 of FIG. 3A. As shown in FIG. 3B, bitlines 34 and wordlines 36 may be formed perpendicular or substantially perpendicular to one another. For example, the bitlines 34 and the wordlines 36 may be formed to cross each other perpendicularly or substantially perpendicularly.

The antifuse array structure shown in FIG. 3B may be similar or substantially similar to the antifuse array structure shown in FIG. 2B, except that the antifuse array structure shown in FIG. 3B may include antifuse structures such as those shown in FIG. 3A.

Referring to FIGS. 2A and 3A, the antifuse structures may differ in that the antifuse 30 of FIG. 3A may include a second diffusing region 33 surrounding the bitline 34 within the semiconductor structure 31, and the bitline 34 in the antifuse structure 30 in FIG. 3A may be smaller than the bitline 23 of the antifuse structure 20 in FIG. 2A. The size and/or shape of the bitline 34 and second diffusing region 33 may be similar or substantially similar to the size and/or shape of the bitline 23 in FIG. 2A.

Figure 4A:
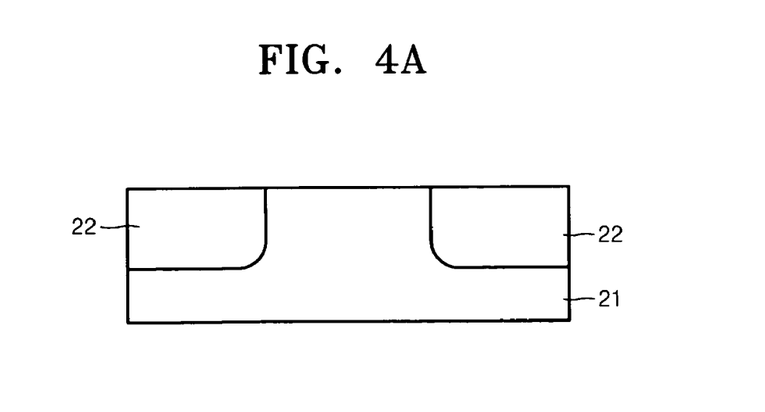
FIGS. 4A through 4C are diagrams illustrating a method of manufacturing an antifuse structure according to an example embodiment.
Figure 4B:
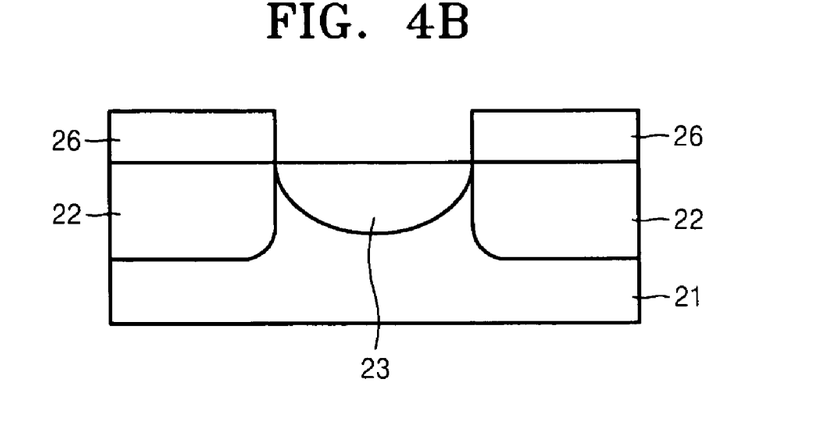
Figure 4C:
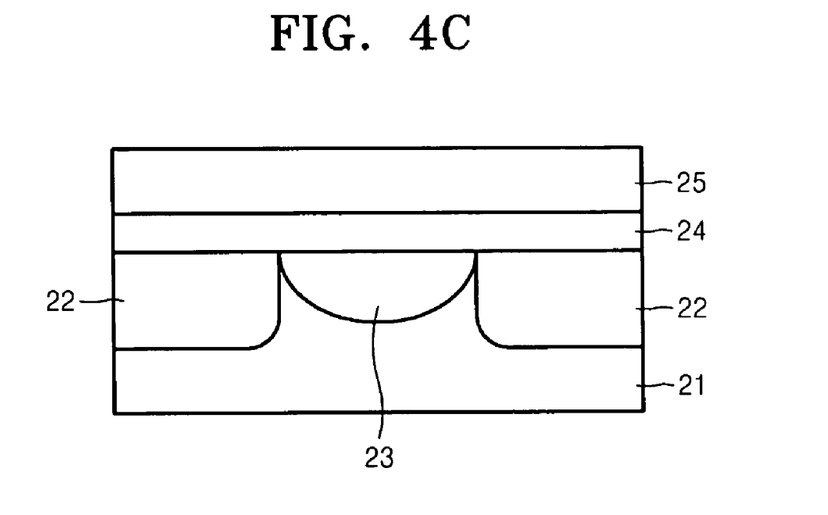

FIGS. 4A through 4C are diagrams illustrating a method of manufacturing an antifuse structure according to an example embodiment. The example method shown in FIGS. 4A through 4C may be used to manufacture or fabricate the antifuse structure 20 shown in FIG. 2A.

Referring to FIGS. 4A and 4B, a plurality of (e.g., two or more) shallow trench isolations or isolation regions 22 may be formed to a first depth in the semiconductor substrate 21. A mask 26 may be formed on the shallow trench isolation regions 22, and the bitline 23 may be formed by doping a region of the semiconductor substrate 21 between the shallow trench isolations 22 (hereinafter the first diffusing region) to a second depth with a first type of dopant. The second depth may be less than the first depth. In forming the bitline 23, the semiconductor substrate 21 may be doped such that the first diffusing region or bitline 23 has a semi-circular, substantially semi-circular, or similar shape. However, the bitline 23 may have any suitable shape. The first type of dopant may be an n-type dopant or a p-type dopant.

Referring to FIG. 4C, the mask 26 may be removed, and the insulation layer 24 and the wordline 25 may be formed (e.g., sequentially formed) on the semiconductor substrate 21. The insulation layer 24 may be formed of a semiconductor insulating material such as $SiO_2$, $Si_3N_4$, or the like. The wordline 25 may be formed of a material doped with a second type of dopant. The second type of dopant may be different from the first type of dopant. For example, if the bitline 23 is formed by doping the first diffusing region with an n-type dopant, the wordline 25 may be formed of, for example, poly-silicon doped with a p-type dopant.

FIGS. 5A through 5F are diagrams illustrating a method of manufacturing an antifuse according to another example embodiment.

Figure 5A:
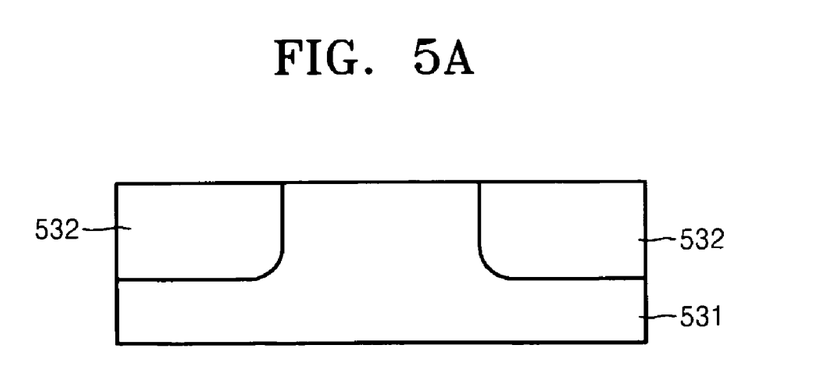
FIGS. 5A through 5F are diagrams illustrating a method of manufacturing an antifuse structure according to another example embodiment.
Figure 5B:
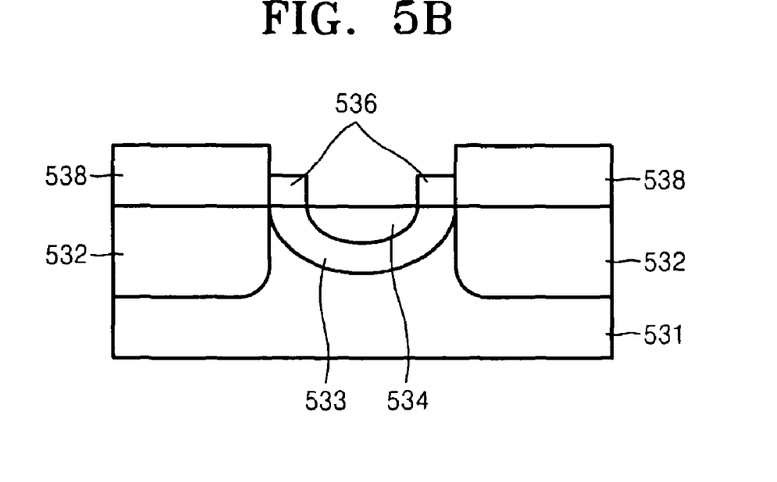

Referring to FIG. 5A, a plurality of (e.g., two or more) shallow trench isolations or isolation regions 532 may be formed to a first depth in the semiconductor substrate 531. In FIG. 5B, a mask 538 may be formed on each of the shallow trench isolations 532, and a second diffusing region 533 may be formed by doping a region of the semiconductor substrate 531 between the shallow trench isolations 532 to a second depth with a first type of dopant. The second depth may be less than the first depth. In forming the second diffusing region 533, the semiconductor substrate 531 may be doped such that the second diffusing region 533 has a semi-circular or similar shape. However, the second diffusing region 533 may have any suitable shape. In one example, the first type of dopant may be an n-type dopant.

A mask or masks 536 may be formed on a surface of the second diffusing region 533, such that a portion of the second diffusing region 533 remains exposed. For example, a mask 536 may be formed at outer portions (e.g., each end) of the second diffusing region 533 such that the center portion of the second diffusing region 533 remains exposed. The exposed portion of the semiconductor substrate 531 may be doped to a third depth with a second type of dopant to form the bitline 534. The third depth may be less than the first and second depths. The bitline 534 may be doped such that the bitline 534 has a semi-circular or similar shape. However, the bitline 534 may have any suitable shape.

The portion of the second diffusing region 533 doped with the second type of dopant may be referred to as the first diffusing region. The second type of dopant may be different from the first type of dopant. In one example, the second type of dopant may be a p-type dopant. However, if the first type of dopant is a p-type dopant, the second type of dopant may be an n-type dopant.

Figure 5C:
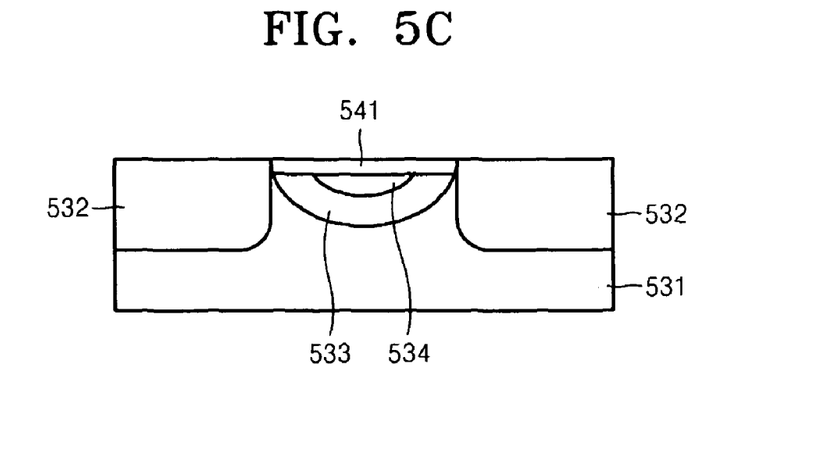
Figure 5D:
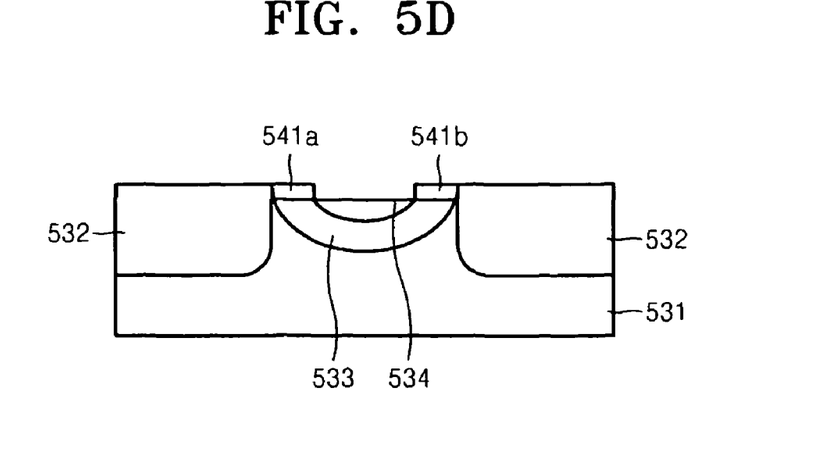
Figure 5E:
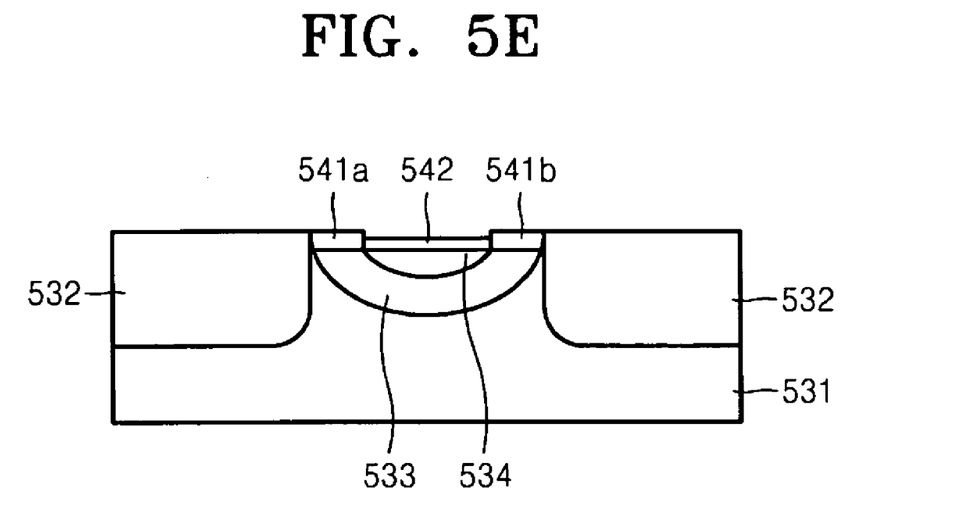

Referring to FIGS. 5C through 5E, a first insulation layer 541 may be formed on the semiconductor substrate 531 by applying an oxide material on a top surface of the semiconductor substrate 531, using a thermal oxidization process or the like. The first insulation layer 541 may be composed of, for example, a semiconductor insulating material such as $SiO_2$, $Si_3N_4$, or the like.

As shown in FIG. 5D, at least a portion of the first insulation layer 541 on a top surface of the bitline 534 may be removed to expose the top surface of the bitline 534. According to at least this example embodiment, a first portion 541A and a second portion 541B of the first insulation layer 541 may remain. A second insulation layer 542 may be formed on the exposed top surface of the bitline 534. The second insulation layer 542 may be thinner than the first insulation layer 541. Alternatively, the portion of the first insulation layer 541 on the top surface of the bitline 534 may be only partially removed so that the portion of the first insulation layer 541 on the top surface of the bitline 534 has a thickness less than remaining portions 541A and 541B of the first insulation layer 541. As a result, the insulation layer 535 may be formed on the semiconductor substrate 531.

As shown in FIG. 5E, the resultant insulation layer 535 may include first and second portions 541A, 541B and a third portion 542. The first and second portions 541A, 541B may cover an upper surface of the second diffusing region 533. The portion 542 may cover the upper surface of the bitline 534. The height or thickness of the second portion 542 may be less then the height or thickness of the portions 541A, 541B.

Figure 5F:
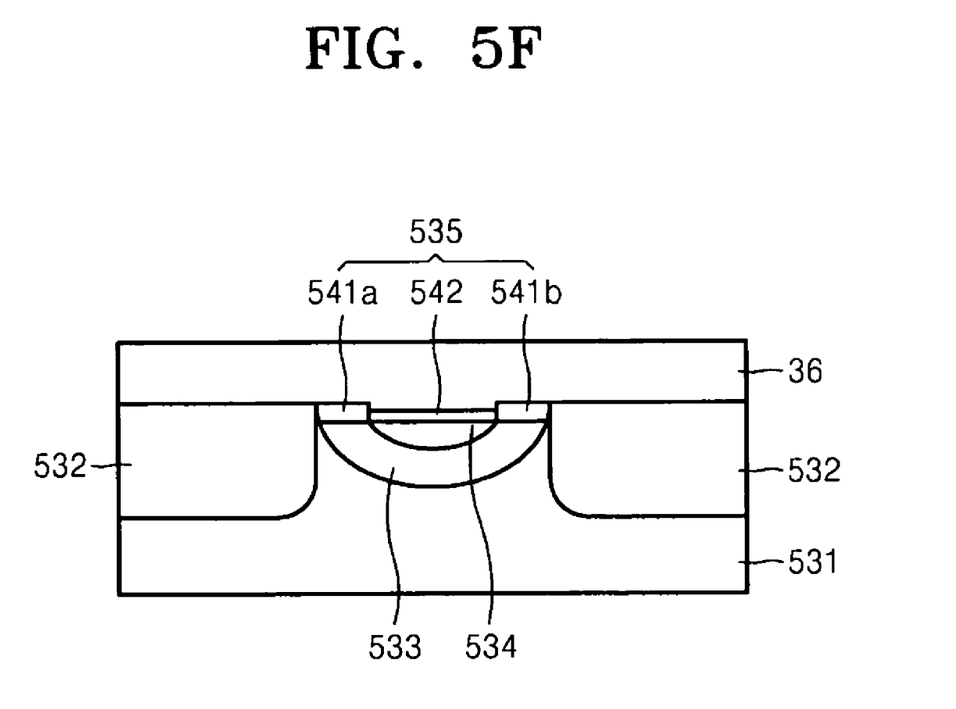

As shown in FIG. 5F, a wordline 536 may be formed by applying a conductive material on the insulation layer 535. The insulation layer portions 541A, 541B, and 542 may be oxide layers formed using a thermal oxidization (or similar) process on the top surface of the semiconductor substrate 531. Alternatively, the insulation layer portions 541A, 541B, and 542 may be formed by applying $SiO_2$, $Si_3N_4$, or the like, on the top surface of the semiconductor substrate 531.

In one example, the wordline 536 may be formed of a material doped with a first type of dopant. For example, if the bitline 534 is doped with a p-type dopant, the wordline 36 may be formed using a material doped with an n-type dopant. Because the second insulation layer 542 on the top surface of the bitline 534 is thinner than the first insulation layer portions 541A, 541B, voltages applied through the wordline 536 and the bitline 534 may be more concentrated to the second insulation layer 542.

A method of driving or operating antifuse cells according to example embodiments will now be described in more detail below.

Figure 6A:
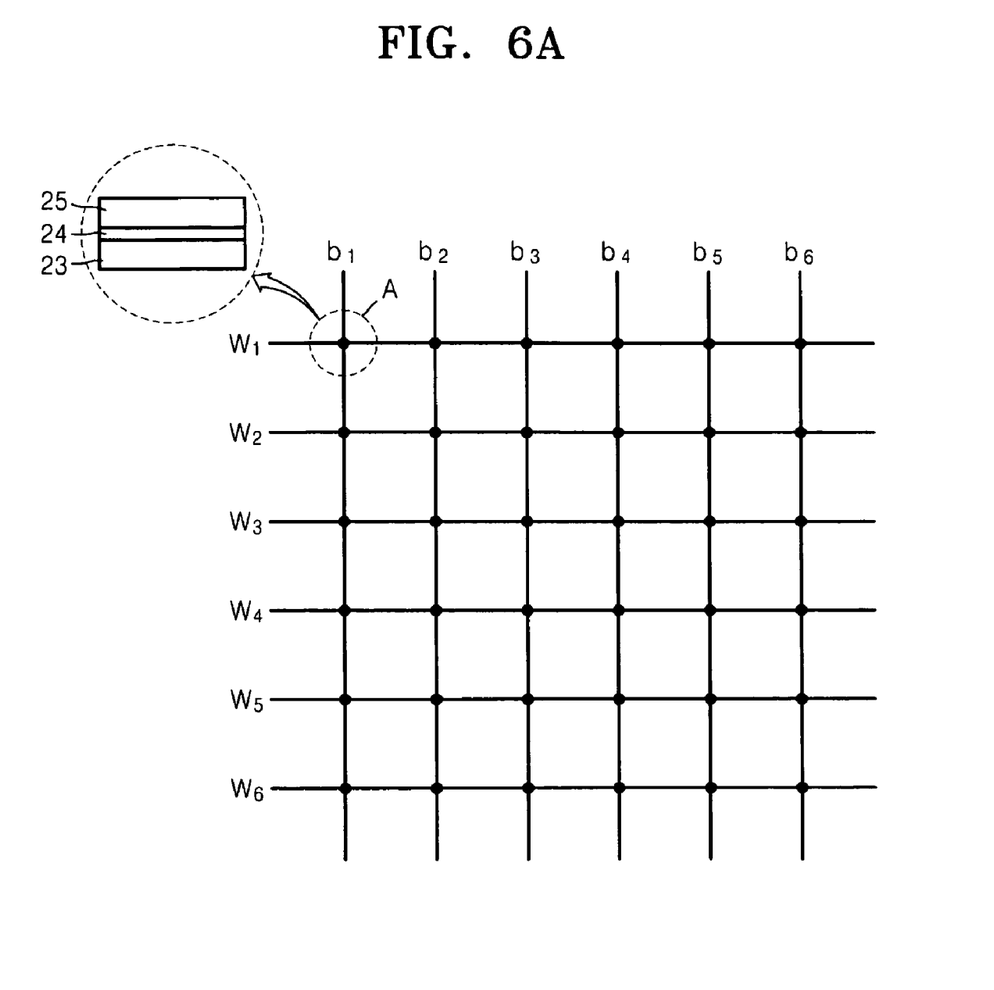
FIGS. 6A and 6B are diagrams illustrating methods of operating antifuse structures according to example embodiments.
Figure 6B:
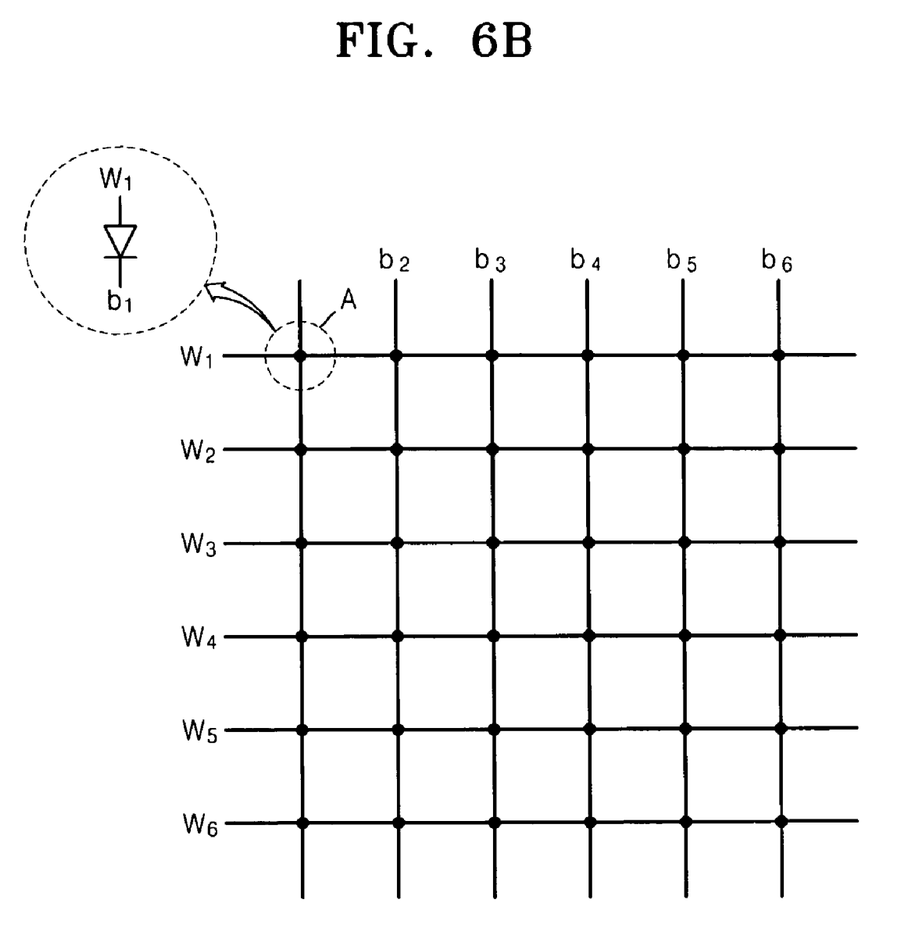

FIGS. 6A and 6B are diagrams illustrating methods of operating antifuse structures according to example embodiments. The methods shown in FIGS. 6A and 6B may be implemented in conjunction with the antifuse structures and/ or antifuse array structures shown in FIGS. 2A, 2B, 3A, and/or 3B.

As shown in FIGS. 6A and 6B, a plurality of bitlines be through $b_6$ and a plurality of wordlines $w_1$ through $w_6$ may be formed to cross each other. Antifuse cells may be formed at intersecting regions (intersections) of the bitlines $b_1$ through $b_6$ and the wordlines $w_1$ through $w_6$.

Referring to FIGS. 2A and 6A, for example, the bitline 23, the insulation layer 24 and the wordline 25 may be formed sequentially in a cell region A. A method of writing data to an antifuse at the cell region A, according to an example embodiment, will be described in more detail below with regard to FIG. 6A. In at least this example embodiment, the bitlines $b_2$ through $b_6$ may be in a floating state, whereas the bitline $b_1$ may be grounded.

The wordlines $w_2$ through $w_6$ may be in a floating state, and a writing (or programming) voltage Vp may be applied to the wordline $w_1$ to write data to the antifuse cell at cell region A. After the data writing operation, each of the cells may function as a diode.

According to at least this example embodiment, each of the cells on the bitline $b_1$ may be selected and programmed simultaneously or concurrently.

A method of reading data written to an antifuse cell at the cell region A, according to an example embodiment, will be described in more detail below with reference to FIG. 6B.

Referring to FIG. 6B, in this example, the bitlines $b_2$ through $b_6$ may be in a floating state, and the bitline $b_1$ may be grounded. The wordlines $w_2$ through $w_6$ may be in a floating state, and a reading voltage Vs may be applied to the wordline $w_1$ to read data written to the antifuse in cell region A.

According to at least this example embodiment, each of the cells on the bitline $b_1$ may be selected and read simultaneously or concurrently.

According to at least some example embodiments, all or substantially all antifuse cells may be connected to each other using a single contact connected to either the bitlines $b_2$ through $b_6$ or the wordlines $w_2$ through $w_6$, and thus, data may be written/read to/from all or substantially all antifuse cells simultaneously or concurrently.

Figure 7A:
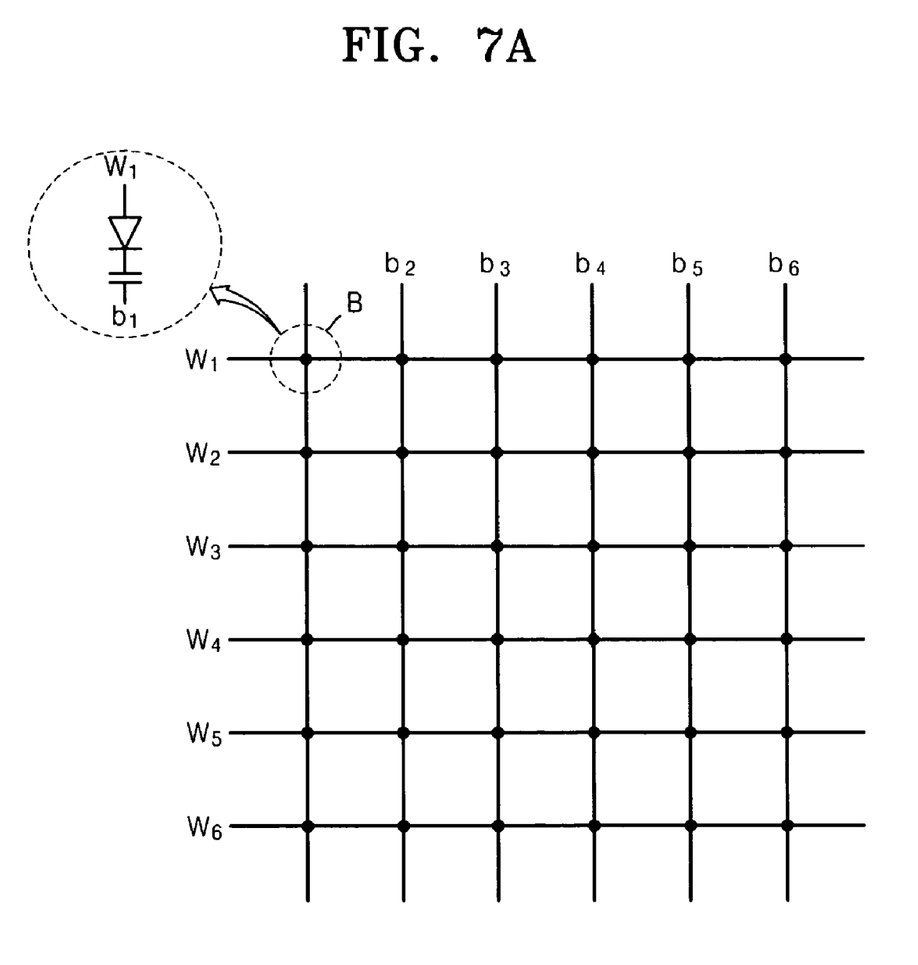
FIGS. 7A and 7B are diagrams illustrating methods of operating antifuse structures according other example embodiments.
Figure 7B:
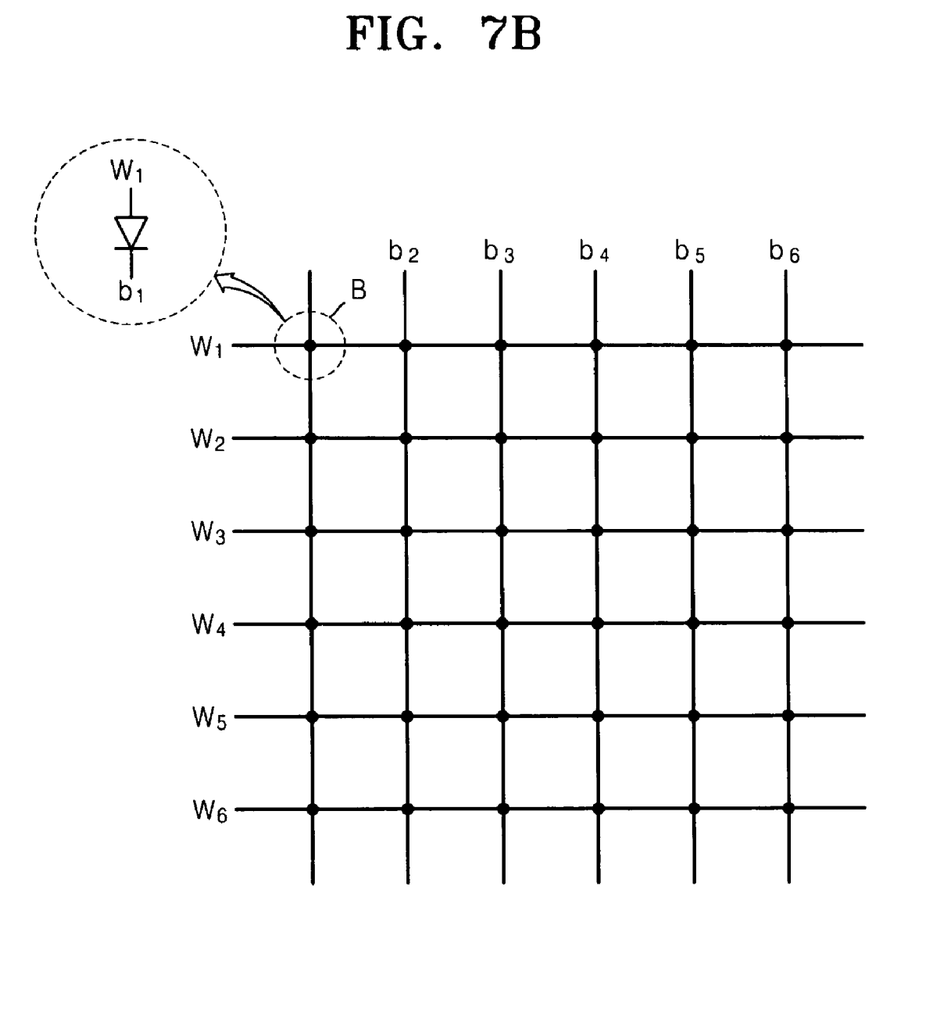

FIGS. 7A and 7B are diagrams for explaining methods of driving or operating antifuse structures according to other example embodiments. The methods shown in FIGS. 7A and 7B may be implemented in conjunction with the antifuse structures and/or antifuse array structures shown in FIGS. 2A, 2B, 3A, and/or 3B.

Referring to FIGS. 7A and 7B, a plurality of bitlines $b_1$ through $b_6$ and a plurality of wordlines $w_1$ through $w_6$ may be formed to cross each other. Antifuse cells may be formed at the intersecting regions (intersections) of the bitlines $b_1$ through $b_6$ and the wordlines $w_1$ through $w_6$. For example, the antifuse cell 30 shown in FIG. 3A may be formed at a cell region B, and thus, a diode and a capacitor may be formed in series.

An example embodiment of a method for writing data to (programming) an antifuse cell at cell region B is described below with regard to FIG. 7A.

Referring to FIG. 7A, the bitlines $b_2$ through $b_6$ may be in a floating state, and the bitline $b_1$ may be grounded. The wordlines $w_2$ through $w_6$ may be in a floating state, and a writing voltage Vp may be applied to the wordline $w_1$ to write data to the antifuse cell.

According to at least this example embodiment, each of the cells on the bitline $b_1$ may be selected and programmed simultaneously or concurrently.

An example embodiment of a method of reading data written to the antifuse cell at the cell region B is described below with reference to FIG. 7B.

Referring to FIG. 7B, the bitlines $b_2$ through $b_6$ may be in a floating state, and the bitline $b_1$ may be grounded. The wordlines $w_2$ through $w_6$ may be in a floating state, and a reading voltage Vs may be applied to the wordline we to read data written in the antifuse cell at cell region B.

According to at least this example embodiment, each of the cells on the bitline $b_1$ may be selected and read simultaneously or concurrently.

According to example embodiments, all or substantially all antifuse cells may be connected by bitlines and wordlines, and thus, data may be written/read to/from all or substantially all antifuse cells simultaneously or concurrently because all or substantially all cells may be selected simultaneously or concurrently. Example embodiments may also provide a simpler antifuse structure.

While example embodiments have been particularly shown and described with reference to the example embodiments shown, it will be understood by those of ordinary skill in the art that various changes in form and details may be made therein without departing from the spirit and scope of the present invention as defined by the following claims.

What is claimed is:

1. An antifuse structure comprising:
    a bitline formed as a first diffusing region within a semiconductor substrate;
    a second diffusing region formed in a region of the semiconductor substrate surrounding the bitline;
    an insulation layer arranged on the bitline and the second diffusing region; and
    a wordline arranged on the insulation layer; wherein
        the insulation layer includes at least a first portion and a second portion, the first portion being vertically aligned with the bitline, and the second portion being vertically aligned with the second diffusing region, and
        the second portion is thicker than the first portion.

2. The antifuse structure of claim 1, wherein the bitline is a region doped with a first dopant, and the second diffusing region is a region doped with a second dopant.

3. The antifuse structure of claim 2, wherein the wordline is doped with the second dopant.

4. The antifuse structure of claim 1, wherein at least one of the second diffusing region and the bitline has a semi-circular shape.

5. The antifuse structure of claim 1, further including,
    a shallow trench isolation formed at each end of the second diffusing region.

6. The antifuse structure of claim 4, wherein the bitline is a region doped with a first dopant, and the wordline is a region doped with a second dopant.

7. The antifuse structure of claim 1, wherein an upper surface of the second portion of the insulation layer is planar with an upper surface of the semiconductor substrate.

8. The antifuse structure of claim 1, wherein the bitline has a first length and a first width, the first length being greater than the first width.

9. The antifuse structure of claim 1, wherein the bitline has a semi-circular shape.

10. An antifuse array structure comprising:
    a plurality of bitlines formed as first diffusing regions in a first direction within a semiconductor substrate;
    a plurality of second diffusing regions, each of the plurality of second diffusing regions being formed in a region of the semiconductor substrate surrounding a corresponding one of the plurality of bitlines;
    an insulation layer formed on the plurality of bitlines and the plurality of second diffusing regions; and
    a plurality of wordlines formed on the insulation layer in a direction crossing the plurality of bitlines; wherein
        the insulation layer includes a plurality of first portions and a plurality of second portions, each of the plurality of first portions being vertically aligned with a corresponding one of the plurality of bitlines, and each of the plurality of second portions being vertically aligned with a corresponding one of the plurality of second diffusing regions, and
        each second portion is thicker than a corresponding first portion.

11. The antifuse array structure of claim 10, wherein the plurality of bitlines are regions doped with a first dopant, and the plurality of wordlines are doped with a second dopant.

12. The antifuse array structure of claim 10, wherein at least one of the plurality of second diffusing regions and the plurality of bitlines has a semi-circular shape.

13. The antifuse array structure of claim 10, further comprising:
    a shallow trench isolation formed at each end of each of the plurality of second diffusing regions.

14. The antifuse array structure of claim 12, wherein the plurality of bitlines are regions doped with a first dopant, and the plurality of wordlines are doped with a second dopant.

15. The antifuse array structure of claim 10, wherein an upper surface of each of the plurality of second portions of the insulation layer is planar with an upper surface of the semiconductor substrate.

16. The antifuse array structure of claim 10, wherein each of the plurality of bitlines has a first length and a first width, the first length being greater than the first width.

17. The antifuse array structure of claim 10, wherein each of the plurality of bitlines are spaced apart from one another by a first distance in the first direction, the first distance being greater than a width of each of the plurality of bitlines.

18. The antifuse array structure of claim 10, wherein each of the plurality of bitlines has a semi-circular shape.

19. A method of manufacturing an antifuse structure, the method comprising:
    forming a bitline as a first diffusing region within a semiconductor substrate;
    forming a second diffusing region in a region of the semiconductor substrate surrounding the bitline;
    forming an insulation layer on the bitline and the second diffusing region; and forming a wordline on the insulation layer; wherein
the insulation layer includes at least a first portion and a second portion, the first portion being vertically aligned with the bitline, and the second portion being vertically aligned with the second diffusing region, and
the second portion is thicker than the first portion.

20. The method of claim 19, wherein the first diffusing region is formed by doping the first diffusing region with a first dopant, and the second diffusing region is formed by doping the second diffusing region with a second dopant, and wherein the second dopant is different from the first dopant.

21. The method of claim 20, further comprising:
forming a shallow trench isolation region at each end of the second diffusing region within the semiconductor substrate.

22. The method of claim 20, wherein an upper surface of the bitline and an upper surface of the second diffusing region contact the insulation layer.

23. A method of manufacturing an antifuse structure, the method comprising:
forming a first diffusing region within a semiconductor substrate, the first diffusing region including a bitline;
forming a second diffusing region in a region of the semiconductor substrate surrounding the bitline;
forming an insulation layer on the bitline and the second diffusing region; and
forming a wordline on the insulation layer; wherein
an upper surface of the bitline and an upper surface of the second diffusing region contact the insulation layer, and
the insulation layer includes at least a first portion and a second portion, the first portion being thicker than the second portion, the forming of the insulation layer including,
forming the first portion of the insulation layer on an upper surface of the second diffusing region, the first portion being vertically aligned with the second diffusing region, and
forming the second portion of the insulation layer on an upper surface of the bitline, the second portion being vertically aligned with the bitline.

24. The method of claim 19, wherein at least one of the second diffusing region and the bitline is formed to have a semi-circular shape.

25. The method of claim 19, further comprising:
forming a shallow trench isolation region at each end of the second diffusing region within the semiconductor substrate.

26. The method of claim 25, wherein the second diffusing region is formed to a first depth in the semiconductor substrate and each shallow trench isolation region is formed to a second depth in the semiconductor substrate, the first depth being less than the second depth.

27. The method of claim 19, wherein an upper surface of the second portion of the insulation layer is formed to be planar with an upper surface of the semiconductor substrate.

28. The method of claim 19, wherein the bitline is formed to have a first length and a first width, the first length being greater than the first width.

29. The method of claim 19, wherein the bitline is formed to have a semi-circular shape.

30. A method of manufacturing an antifuse array, the method comprising:
forming a plurality of antifuse structures in an array structure, each of the plurality of antifuse structures being formed in accordance with the method of claim 19.

31. The method of claim 30, wherein the first diffusing region of at least one of the plurality of antifuse structures is formed by doping the first diffusing region with a first dopant, and the second diffusing region is formed by doping the second diffusing region with a second dopant, and wherein the second dopant is different from the first dopant.

32. The method of claim 31, wherein, for at least one of the plurality of antifuse structures, the method further includes,
forming a shallow trench isolation region at each end of the second diffusing region within the semiconductor substrate.

33. The method of claim 31, wherein an upper surface of the bitline and an upper surface of the second diffusing region of at least one of the plurality of antifuse structures contacts a corresponding one of the first and second portions of the insulation layer.

34. The method of claim 33, wherein the forming of the insulation layer comprises:
forming the first portion of the insulation layer on an upper surface of the bitline, and
forming the second portion of the insulation layer on an upper surface of a the second diffusing region.

35. The method of claim 31, wherein at least one of the plurality of second diffusing regions and the plurality of bitlines are formed to have a semi-circular shape.

36. The method of claim 30, further comprising:
forming a shallow trench isolation region within the semiconductor substrate at each end of each of the plurality of second diffusing regions.

37. The method of claim 36, wherein each second diffusing region is formed to a first depth in the semiconductor substrate and each shallow trench isolation region is formed to a second depth in the semiconductor substrate, the first depth being less than the second depth.

38. The method of claim 30, wherein an upper surface of each of the plurality of second portions of the insulation layer is formed to be planar with an upper surface of the semiconductor substrate.

39. The method of claim 30, wherein each of the plurality of bitlines is formed to have a first length and a first width, the first length being greater than the first width.

40. The method of claim 30, wherein each of the plurality of bitlines are spaced apart from one another by a first distance, the first distance being greater than a width of each of the plurality of bitlines.

41. The method of claim 30, wherein each of the plurality of bitlines is formed to have a semi-circular shape.

42. An antifuse structure comprising:
at least one bitline formed within a semiconductor substrate, the bitline being a portion of the semiconductor substrate doped with a first dopant;
at least one second diffusing region formed in a region of the semiconductor substrate surrounding the at least one bitline;
at least one insulation layer formed on the bitline and the second diffusing region; and
at least one wordline formed on the at least one insulation layer, the at least one wordline being doped with a second dopant, the second dopant being different from the first dopant; wherein
the at least one insulation layer includes at least a first portion and a second portion, the first portion being vertically aligned with the at least one bitline, and the second portion being vertically aligned with the at least one second diffusing region, and
the second portion is thicker than the first portion.

43. The antifuse structure of claim 42, wherein the second diffusing region is doped with the second dopant.

44. The antifuse structure of claim 42, wherein at least one of the second diffusing region and the at least one bitline has a semi-circular shape.

45. The antifuse structure of claim 42, further comprising:
a shallow trench isolation formed at each end of the at least one second diffusing region within the semiconductor substrate.

46. The antifuse structure of claim 42, wherein an upper surface of the second portion of the insulation layer is planar with an upper surface of the semiconductor substrate.

47. The antifuse structure of claim 42, wherein the at least one bitline has a semi-circular shape.

48. The antifuse structure of claim 42, wherein the at least one wordline is formed perpendicular to the at least one bitline.

49. An antifuse array structure comprising:
a plurality of the antifuse structures of claim 42, wherein each of the bitlines intersects with a plurality of wordlines.

50. The antifuse array structure of claim 49, wherein at least one of the plurality of second diffusing regions and the plurality of bitlines has a semi-circular shape.

51. The antifuse array structure of claim 49, wherein each of the plurality of antifuse structures includes,
a shallow trench isolation region formed at each end of the second diffusing region.

52. The antifuse array structure of claim 49, wherein an upper surface of each of the second portions is planar with an upper surface of the semiconductor substrate.

53. The antifuse array structure of claim 49, wherein each of the plurality of bitlines are spaced apart from one another by a first distance, the first distance being greater than a width of each of the plurality of bitlines.

54. The antifuse array structure of claim 49, wherein each of the plurality of bitlines has a semi-circular shape.

55. A method of manufacturing an antifuse array, the method comprising:
forming a plurality of antifuse structures in an array structure, each of the plurality of antifuse structures being formed in accordance with the method of claim 23.

* * * * *